United States Patent
LeBoeuf, II et al.

(10) Patent No.: US 7,724,043 B1
(45) Date of Patent: May 25, 2010

(54) COMMON MODE CONTROLLER FOR A SAMPLE-AND-HOLD CIRCUIT

(75) Inventors: Robert J. LeBoeuf, II, Salem, NH (US); Matthew Courcy, Fremont, NH (US)

(73) Assignee: National Semiconductor Corporation, Santa Clara, CA (US)

( * ) Notice: Subject to any disclaimer, the term of this patent is extended or adjusted under 35 U.S.C. 154(b) by 89 days.

(21) Appl. No.: 11/775,745

(22) Filed: Jul. 10, 2007

(51) Int. Cl.
 *H03K 5/00* (2006.01)

(52) U.S. Cl. .......................................... 327/91; 327/94
(58) Field of Classification Search ................. 327/65, 327/66, 72, 77, 89, 103
 See application file for complete search history.

(56) References Cited

U.S. PATENT DOCUMENTS

| | | | |
|---|---|---|---|
| 5,488,321 A * | 1/1996 | Johnson | 327/66 |
| 5,578,964 A | 11/1996 | Kim et al. | |
| 5,668,468 A * | 9/1997 | Cargill | 323/316 |
| 5,990,743 A | 11/1999 | Gabara | |
| 6,107,882 A | 8/2000 | Gabara et al. | |
| 6,504,403 B2 * | 1/2003 | Bangs et al. | 327/62 |
| 6,507,223 B2 * | 1/2003 | Felder | 327/77 |
| 6,590,436 B2 * | 7/2003 | Jordanger et al. | 327/333 |
| 7,009,541 B1 | 3/2006 | Nguyen | |
| 7,050,116 B2 | 5/2006 | Van Zanten et al. | |
| 7,205,797 B1 | 4/2007 | Maheshwari et al. | |

* cited by examiner

*Primary Examiner*—Tuan Lam
*Assistant Examiner*—Hiep Nguyen
(74) *Attorney, Agent, or Firm*—Patent Law Group LLP; Carmen C. Cook

(57) ABSTRACT

A common mode controller circuit (60) for maintaining a common mode voltage (Vcm) at a first node (52) and a second node (54) in a sample-and-hold circuit receiving a pair of AC coupled differential input signals (Vinp, Vinn) includes first and second resistors (R1/R2) and third and fourth resistors (R3/R4), each set of resistors connected in series between the first and second nodes, and a differential amplifier (A1) having an inverting input terminal coupled to a third node (62) between the first and second resistors, a non-inverting input terminal coupled to a reference voltage (Vref) and an output terminal coupled to a fourth node (64) between the third and fourth resistors. The common mode voltage is sampled at the third node and the differential amplifier provides a sourcing output current indicative of the difference between the sampled common mode voltage and the reference voltage to drive the fourth node.

15 Claims, 2 Drawing Sheets

COMMON MODE CONTROLLER FOR A SAMPLE-AND-HOLD CIRCUIT

FIELD OF THE INVENTION

The invention relates to sample-and-hold circuits used as front-end stage for analog-to-digital converters (ADCs) and, in particular, to a common mode controller for use in a sample-and-hold circuit receiving a pair of differential input signals through AC coupling.

DESCRIPTION OF THE RELATED ART

Analog-to-digital converters (ADCs) are typically implemented using a sample-and-hold circuit as the front-end stage. In some applications, the ADC receives a pair of differential input signals and the differential input signals are AC coupled to the sample-and-hold circuit. FIG. 1 is a schematic diagram of a conventional sample-and-hold circuit in an ADC where a pair of differential input signals is provided to the sample-and-hold circuit through AC coupling. Referring to FIG. 1, differential input signals Vp and Vn are AC coupled through respective capacitors C1 and C2 to respective differential input terminals 12, 14 as input signals Vinp and Vinn to a sample-and-hold circuit 10 forming the front-end stage of ADC 1.

At the sample-and-hold circuit 10, the differential input signals Vinp and Vinn are sampled onto respective input capacitors C3 and C4 through switches S1 and S2 during the input sampling phase. A pair of switches S3A and S3B is activated to short the right plates (nodes 16 and 17) of input capacitors C3 and C4 to the common mode voltage Vcm during the input sampling phase. The sampled differential input signals are held on capacitors C3 and C4 during the hold phase through the operation of switches S4 and S5 forming a feedback loop around a sample-and-hold amplifier 20. Switches S1/S2/S3A/S3B and switches S4/S5 are driven with non-overlapping clock signals to operate the sample-and-hold circuit 10 alternately in the input sampling phase and in the hold phase. During the input sampling phase, switches S1, S2, S3A and S3B are closed and switches S4 and S5 are open to sample the AC coupled differential input signals Vinp and Vinn at nodes 12 and 14 onto capacitors C3 and C4. During the hold phase, switches S1, S2, S3A and S3B are open and switches S4 and S5 are closed to connect the left plates (nodes 13 and 15) of capacitors C3 and C4 to the differential output terminals (nodes 18 and 19) of amplifier 20. Amplifier 20 provides differential output signals Voutp and Voutn which are provided to subsequent circuitry of the ADC 1 for further processing. ADC 1 includes other analog-to-digital conversion circuitry that are not shown in FIG. 1 to simplify the discussion.

Sample-and-hold circuit 10 shown in FIG. 1 is referred to as a flip around sample-and-hold circuit. Flip around sample-and-hold circuits typically have tight common mode requirement.

Switches S1 and S2 inherently suffer from leakages, as represented by leakage current Is. Due to the presence of leakage current Is during the sampling phase, the common mode voltage Vcm tends to drop towards 0 volt. More specifically, the common mode voltage Vcm is given as:

$$Vcm = \frac{Vinp + Vinn}{2}.$$

When the differential input voltages Vinp and Vinn drop towards 0 volt because of the leakage current Is, the common mode voltage Vcm also drifts towards 0 volt. The dropping of the common mode voltage Vcm to 0 volt is undesirable because the sample-and-hold circuit operates correctly only for a given predefined common mode voltage, such as a common mode voltage of 1.5V+/−10%.

DETAILED DESCRIPTION OF THE PREFERRED EMBODIMENTS

In accordance with the principles of the present invention, a sample-and-hold circuit receiving a pair of differential input signals through AC coupling includes a common mode controller circuit for monitoring and maintaining the common mode voltage (Vcm) of the differential input signals. The common mode controller provides a current to the sample-and-hold circuit to maintain the common mode voltage within a desired voltage range. In this manner, the differential input signals may be AC coupled to the sample-and-hold circuit without suffering from a loss of common mode range due to leakages in the sample-and-hold circuit. In one application, the sample-and-hold circuit forms the front-end stage of an AC-coupled analog-to-digital converter (ADC).

Figure 1:
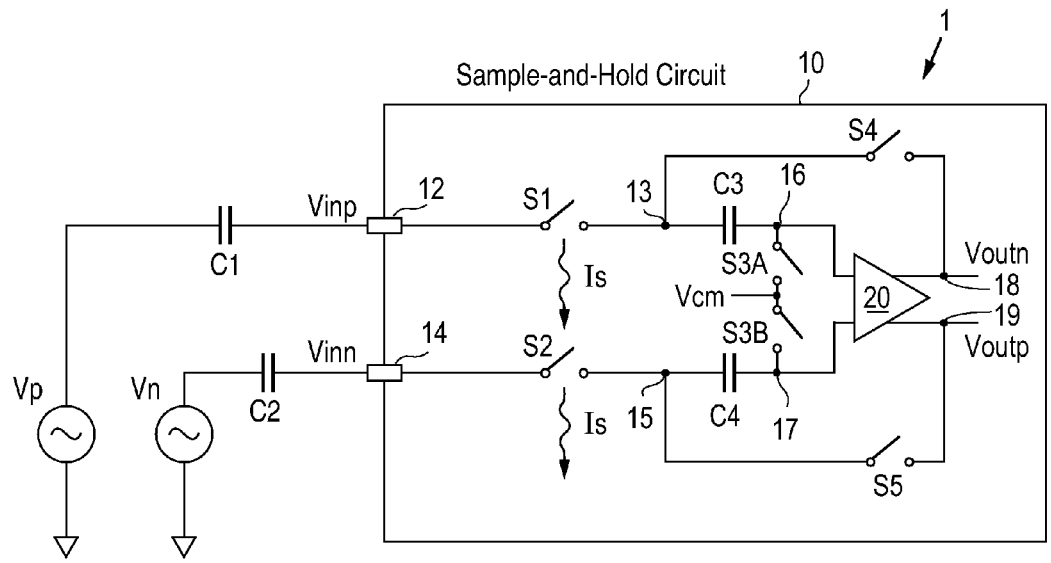
FIG. 1 is a schematic diagram of a conventional sample-and-hold circuit in an ADC where a pair of differential input signals is provided to the sample-and-hold circuit through AC coupling.
Figure 2:
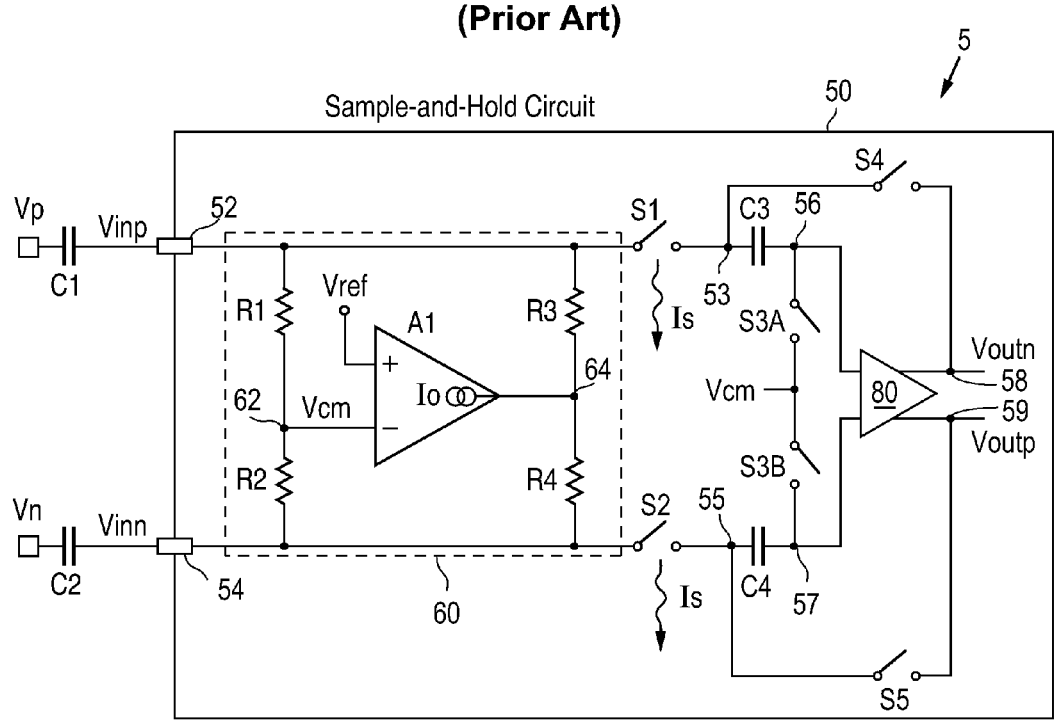
FIG. 2 is a schematic diagram of a sample-and-hold circuit incorporating a common mode controller according to one embodiment of the present invention.

FIG. 2 is a schematic diagram of a sample-and-hold circuit incorporating a common mode controller according to one embodiment of the present invention. Referring to FIG. 2, a sample-and-hold circuit 50 forming the front-end stage of an ADC 5 receives a pair of differential input signals through AC coupling. More specifically, differential input signals Vp and Vn of ADC 5 are AC coupled through respective capacitors C1 and C2 to input terminals 52 and 54 as differential input signals Vinp and Vinn.

At sample-and-hold circuit 50, the differential input signals Vinp and Vinn are sampled onto respective input capacitors C3 and C4 through switches S1, S2, S3A and S3B during the input sampling phase and are held on capacitors C3 and C4 through switches S4 and S5 during the hold phase. Switches S1/S2/S3A/S3B and switches S4/S5 are driven with non-overlapping clock signals to operate the sample-and-hold circuit 50 alternately in the input sampling phase and in the hold phase.

During the input sampling phase, switches S1, S2, S3A and S3B are closed and switches S4 and S5 are open to sample the AC coupled differential input signals Vinp and Vinn at nodes 52 and 54 onto capacitors C3 and C4. Switches S3A and S3B are activated to short the right plates (nodes 56 and 57) of input capacitors C3 and C4 to the common mode voltage Vcm during the input sampling phase. During the hold phase, switches S1, S2, S3A and S3B are open and switches S4 and S5 are closed to connect the left plates (nodes 53 and 55) of capacitors C3 and C4 to the differential output terminals (nodes 58 and 59) of a sample-and-hold amplifier 80. When switches S4 and S5 are closed, capacitors C3 and C4 are configured in a feedback loop around amplifier 80. Amplifier 80 provides differential output signals Voutp and Voutn which are provided to subsequent circuitry of the ADC 5 for further processing. ADC 5 may include other analog-to-digital conversion circuitry not shown in FIG. 2.

Switches S1 and S2 inherently suffer from leakages, as represented by leakage current Is. As a result, the common mode voltage Vcm of the input signals Vinp and Vinn tends to drop towards 0 volt. In accordance with one embodiment of the present invention, sample-and-hold circuit 50 incorporates a common mode controller 60 which operates to maintain the input common mode voltage Vcm within a desired voltage range. The desired voltage range is established by a reference voltage Vref, as described below. In one embodiment, the common mode voltage is supply invariant (i.e., does not vary with the power supply voltage) and is set to a desired voltage range of 1.5V+/−10%.

In the present embodiment, common mode controller 60 includes a resistor R1 and a resistor R2 connected in series between the different input terminals (nodes 52 and 54). The common mode voltage Vcm of the input signals Vinp and Vinn is thus established at the common node 62 between resistor R1 and resistor R2. Common mode controller 60 also includes a differential amplifier A1 having an inverting input terminal coupled to receive the sampled common mode voltage Vcm on node 62 and a non-inverting input terminal coupled to receive a reference voltage Vref. Reference voltage Vref has a voltage value indicative of the desired common mode voltage for the ADC input signals. In one embodiment, the reference voltage Vref is 1.5V indicating a desired common mode voltage about 1.5V. Differential amplifier A1 provides an output current Io at its output terminal indicative of the difference between the sampled common mode voltage Vcm on node 62 and the reference voltage Vref.

Common mode controller 60 further includes a resistor R3 and a resistor R4 connected in series between the differential input terminals (nodes 52 and 54). Differential amplifier A1 drives the common node 64 between resistor R3 and resistor R4. During the sampling phase when switches S1, S2, S3A and S3B are closed, the leakage current Is at each of switch S1 and switch S2 always flows in one direction to cause the voltages at nodes 53 and 55 to be discharged. That is, the AC coupled differential input voltages Vinp and Vinn are being discharged by the leakage current Is. Thus, the input common mode voltage Vcm always tends to decrease due to the leakage current Is. In order to maintain the common mode voltage Vcm within the desired voltage range, amplifier A1 only needs to source current at the amplifier output terminal. Thus, the output current Io is a sourcing current operative to charge up the voltage at node 64. The output current Io is indicative of the error voltage Vref-Vcm measured by amplifier A1. Amplifier A1 supplies the necessary output current Io in response to the error voltage to drive the voltage at node 64 to the desired common mode voltage value, given as:

$$Vcm = \frac{Vinp + Vinn}{2}.$$

When node 64 is thus driven, resistors R3 and R4 drive their respective nodes 52, 54 so that the common mode voltage Vcm at the differential input terminals 52, 54 is maintained within the desired voltage range. In operation, resistors R3 and R4 operate as a voltage bridge for holding differential input terminals 52, 54 at the desired Vcm voltage.

In one embodiment, resistor R1 and resistor R2 have the same resistance values. Furthermore, resistor R3 and resistor R4 have the same resistance values. In one embodiment, amplifier A1 is a high current gain amplifier so as to maintain good common mode correction over a wide range of sampling clock frequencies. In an alternate embodiment, amplifier A1 is constructed in a manner so that the bias current for the amplifier is sampling clock frequency dependent. In that case, amplifier A1 can be constructed using a low gain amplifier while providing good common mode correction over a wide range of sampling clock frequencies. Besides, a few millivolts offset on the common mode voltage will not negatively impact the ADC operation. It is only critical that the common mode voltage is within the desired voltage range (such as 1.5V+/−10%) and not at 0 volt or at the positive power supply voltage Vdd.

As thus constructed, the common mode controller of the present invention provides a source current Io that is approximately equal to the leakage current Is. As a result, the common mode controller operates to replenish the current taken away by the leakage current Is so that the common mode voltage Vcm of the AC coupled input signals is not affected by the leakage currents that may be present at the switches of the sample-and-hold circuit of the ADC.

Figure 3:
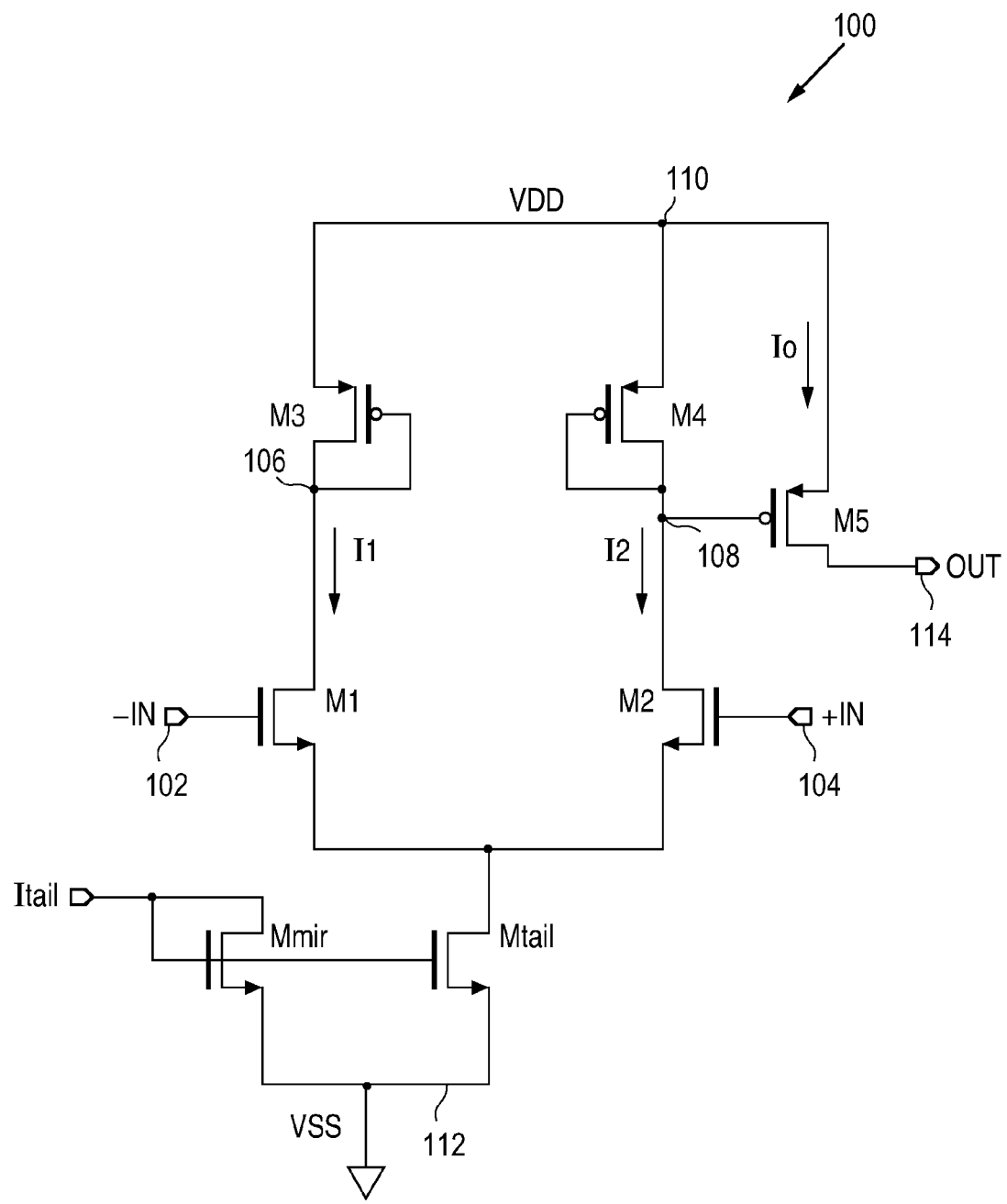
FIG. 3 is a transistor level schematic diagram of the amplifier in the common mode controller of FIG. 2 according to one embodiment of the present invention.

FIG. 3 is a transistor level schematic diagram of the amplifier in the common mode controller of FIG. 2 according to one embodiment of the present invention. Referring to FIG. 3, amplifier 100 is a differential amplifier with a mirrored current. More specifically, amplifier 100 is a gm-on-gm amplifier. Amplifier 100 includes an input node 102 being the inverting input terminal receiving a first input signal −IN and an input node 104 being the non-inverting input terminal receiving a second input signal +IN. The input nodes are gate terminals of an input differential pair formed by NMOS transistors M1 and M2. PMOS transistors M3 and M4 serve as load transistors to the input differential pair. A current I1 flows into the drain terminal of transistor M1 and a current I2 flows into the drain terminal of transistor M2.

To bias the differential pair, a tail current Itail is provided to a diode-connected NMOS transistor Mmir. The tail current Itail is mirrored by NMOS transistor Mtail. Transistor Mtail supplies the bias current for the input differential pair of transistors M1 and M2.

Current I2 at transistor M2 is varied in response to the differences in the input voltages at the input nodes 102 and 104. Current I2 is mirrored by a PMOS transistor M5 as the output current Io. The output current Io is provided on an output terminal 114. More specifically, PMOS transistor M5 has its gate terminal connected to node 108 being the drain terminal of transistor M2 and through which current I2 flows. The source terminal of transistor M5 is connected to the power supply voltage Vdd (node 110) and the drain terminal of transistor M5 is the output terminal 114. As thus configured, transistor M5 source current from the power supply and provides the sourcing current as the output current Io.

Amplifier 100 illustrates one amplifier circuit which can be used to implement the common mode controller of the present invention. Other amplifier circuits can also be used as long as the amplifier circuit can be constructed to provide a sourcing current as the output current.

Returning to FIG. 2, the leakage current Is from switches S1 and S2 is a function of the clock frequency of the sampling clock signals driving switches S1 and S2. Therefore, the common mode voltage drop resulting from the leakage current Is will also vary with the clock rate of the clock signals. According to another aspect of the present invention, the tail current Itail (FIG. 3) provided to bias amplifier 100 is made clock frequency dependent so as to duplicate the frequency-dependent variance of the leakage current. As mentioned above, when the tail current Itail tracks the sampling clock frequency variations, a very low gain differential amplifier can be used to implement amplifier A1 to achieve tight common-mode control over a wide range of clock frequencies. The differential nature of the amplifier will correct the absolute difference between the leakage Is and bias current Itail. Using a low gain differential amplifier has particular advantages because a low gain differential amplifier makes stabilizing the input common-mode circuit much easier as compensation requirements are significantly relaxed.

The above detailed descriptions are provided to illustrate specific embodiments of the present invention and are not intended to be limiting. Numerous modifications and variations within the scope of the present invention are possible. The present invention is defined by the appended claims.

We claim:

1. A common mode controller circuit (60) for maintaining a common mode voltage (Vcm) at a first node (52) and a second node (54) in a sample-and-hold circuit (50), the first node and the second node receiving a pair of AC coupled differential input signals (Vinp, Vinn), the common mode controller circuit comprising:

a first resistor (R1) and a second resistor (R2) connected in series between the first node and the second node;

a third resistor (R3) and a fourth resistor (R4) connected in series between the first node and the second node; and a low gain differential amplifier (A1) having an inverting input terminal coupled to a third node (62) between the first resistor and the second resistor, a non-inverting input terminal coupled to a reference voltage (Vref) and an output terminal coupled to a fourth node (64) between the third resistor and the fourth resistor, the low gain differential amplifier (A1) providing an output current being a sourcing current at the output terminal, wherein the common mode voltage (Vcm) is sampled at the third node (62) and the low gain differential amplifier (A1) provides an output current indicative of the difference between the sampled common mode voltage and the reference voltage to drive the fourth node (64), thereby maintaining the common mode voltage at a predetermined value;

wherein the low gain differential amplifier comprises:

an input differential pair of first and second transistors (M1, M2) receiving the sampled common mode voltage and the reference voltage as input signals, a drain terminal (108) of the second transistor providing a first output current;

a third transistor (Mtail) providing a tail current to the input differential pair;

a fourth transistor (M3) being diode-connected and coupled to the first transistor to provide loading;

a fifth transistor (M4) being diode connected and coupled to the second transistor to provide load; and a sixth transistor (M5) configured as a current mirror of the fifth transistor, the sixth transistor providing a second output current being the output current of the low gain differential amplifier, the second output current being a sourcing current; and wherein the first node and the second node comprise the differential input nodes (52, 54) of an analog-to-digital converter (ADC) (5) including the sample-and-hold circuit (50) as an input stage where the sample-and-hold circuit receives a pair of differential input signals through AC coupling; and the first node is connected to a first input capacitor (C3) of the sample-and-hold circuit through a first switch (S1) and the second node is switchably connected to a second input capacitor (C4) of the sample-and-hold circuit through a second switch (S2), the first and second switches being controlled by a clock signal.

2. The common mode controller circuit of claim 1, wherein the resistance values of resistors R1 and R2 are the same and the resistance values of resistors R3 and R4 are the same.

3. The common mode controller circuit of claim 1, wherein the reference voltage has a voltage value being the desired voltage value of the common mode voltage.

4. The common mode controller circuit of claim 1, wherein the first, second and third transistors comprise NMOS transistors and the fourth, fifth and sixth transistors comprise PMOS transistors, and wherein the sixth transistor has a gate terminal coupled to the drain terminal (108) of the second transistor, a source terminal (110) coupled to a positive power supply voltage and a drain terminal (114) being the output terminal of the low gain differential amplifier.

5. The common mode controller circuit of claim 1, wherein the tail current provided by the third transistor (Mtail) varies with a frequency of the clock signal controlling the first and second switches.

6. A method for maintaining a common mode voltage (Vcm) at a first node (52) and a second node (54), the first node and the second node receiving a pair of AC coupled differential input signals (Vinp, Vinn) in a sample-and-hold circuit (50), the method comprising:

sampling the common mode voltage of the pair of differential input signals;

comparing the sampled common mode voltage to a reference voltage comprising coupling the sampled common mode voltage and the reference voltage to a low gain differential amplifier (A1); and providing the output current at the low gain differential amplifier, the output current being a sourcing current indicative of the difference between the sampled common mode voltage and the reference voltage;

generating an output current being a sourcing current indicative of the difference between the sampled common mode voltage and the reference voltage; and driving the first and second nodes using the output current, thereby maintaining the common mode voltage at a predetermined value;

wherein the first node and the second node comprise the differential input nodes (52, 54) of an analog-to-digital converter (ADC) (5) including the sample-and-hold circuit (50) as an input stage where the sample-and-hold circuit receives a pair of differential input signals through AC coupling and wherein the sample-and-hold circuit is operated based on a first clock signal, the method further comprising:

biasing the low gain differential amplifier using a tail current that varies with a frequency of the clock signal controlling the first and second switches;

connecting the first node to a first input capacitor (C3) of the sample-and-hold circuit through a first switch (S1); and connecting the second node to a second input capacitor (C4) of the sample-and-hold circuit through a second switch (S2), the first and second switches being controlled by the first clock signal.

7. The method of claim 6, wherein sampling the common mode voltage of the pair of differential input signals comprises:

coupling a first resistor (R1) and a second resistor (R2) having equal resistance values between the first and second nodes, the sampled common mode voltage being developed at a common node (62) between the first resistor and the second resistor.

8. The method of claim 6, wherein the reference voltage has a voltage value being the desired voltage value of the common mode voltage.

9. The method of claim 6, wherein driving the first and second nodes using the output current comprises:
coupling a third resistor (R3) and a fourth resistor (R4) having equal resistance values between the first and second nodes, the output current being driven onto a common node (64) between the third resistor and the fourth resistor.

10. A common mode controller circuit (60) for maintaining a common mode voltage (Vcm) at a first node (52) and a second node (54) in a sample-and-hold circuit (50), the first node and the second node receiving a pair of AC coupled differential input signals (Vinp, Vinn), the common mode controller circuit comprising:
a first resistor (R1) and a second resistor (R2) connected in series between the first node and the second node;
a third resistor (R3) and a fourth resistor (R4) connected in series between the first node and the second node; and
a low gain differential amplifier (A1) having an inverting input terminal coupled to a third node (62) between the first resistor and the second resistor, a non-inverting input terminal coupled to a reference voltage (Vref) and an output terminal coupled to a fourth node (64) between the third resistor and the fourth resistor, the low gain differential amplifier (A1) providing an output current being a sourcing current at the output terminal,
wherein the common mode voltage (Vcm) is sampled at the third node (62) and the low gain differential amplifier (A1) provides an output current indicative of the difference between the sampled common mode voltage and the reference voltage to drive the fourth node (64), thereby maintaining the common mode voltage at a predetermined value; and
wherein the first node and the second node comprise the differential input nodes (52, 54) of an analog-to-digital converter (ADC) (5) including the sample-and-hold circuit (50) as an input stage where the sample-and-hold circuit receives a pair of differential input signals through AC coupling; and the first node is connected to a first input capacitor (C3) of the sample-and-hold circuit through a first switch (S1) and the second node is switchably connected to a second input capacitor (C4) of the sample-and-hold circuit through a second switch (S2), the first and second switches being controlled by a clock signal.

11. The common mode controller circuit of claim 10, wherein the low gain differential amplifier comprises:
an input differential pair of first and second transistors (M1, M2) receiving the sampled common mode voltage and the reference voltage as input signals, a drain terminal (108) of the second transistor providing a first output current;
a third transistor (Mtail) providing a tail current to the input differential pair;
a fourth transistor (M3) being diode-connected and coupled to the first transistor to provide loading;
a fifth transistor (M4) being diode connected and coupled to the second transistor to provide load; and
a sixth transistor (M5) configured as a current mirror of the fifth transistor, the sixth transistor providing a second output current being the output current of the low gain differential amplifier, the second output current being a sourcing current.

12. The common mode controller circuit of claim 10, wherein the resistance values of resistors R1 and R2 are the same and the resistance values of resistors R3 and R4 are the same.

13. The common mode controller circuit of claim 10, wherein the reference voltage has a voltage value being the desired voltage value of the common mode voltage.

14. The common mode controller circuit of claim 10, wherein the first, second and third transistors comprise NMOS transistors and the fourth, fifth and sixth transistors comprise PMOS transistors, and wherein the sixth transistor has a gate terminal coupled to the drain terminal (108) of the second transistor, a source terminal (110) coupled to a positive power supply voltage and a drain terminal (114) being the output terminal of the low gain differential amplifier.

15. The common mode controller circuit of claim 10, wherein the tail current provided by the third transistor (Mtail) varies with a frequency of the clock signal controlling the first and second switches.

\* \* \* \* \*